United States Patent [19]

Crist et al.

[11] Patent Number: 4,734,586
[45] Date of Patent: Mar. 29, 1988

[54] FOIL CHANGING APPARATUS

[75] Inventors: Charles E. Crist; Harry C. Ives; Gordon T. Leifeste; Robert B. Miller, all of Albuquerque, N. Mex.

[73] Assignee: The United States of America as represented by the United States Department of Energy, Washington, D.C.

[21] Appl. No.: 836,883

[22] Filed: Mar. 6, 1986

[51] Int. Cl.[4] ............................................. H01J 33/04
[52] U.S. Cl. ............................ 250/503.1; 250/442.3; 313/420
[58] Field of Search ............... 250/492.3, 493.1, 503.1, 250/505.1; 313/420

[56] References Cited

U.S. PATENT DOCUMENTS

| | | | |
|---|---|---|---|
| 1,510,470 | 10/1924 | DunLany et al. | 88/29 |
| 1,745,718 | 2/1930 | Sargent | 352/129 |
| 2,123,882 | 7/1938 | Draeger | 352/129 |
| 2,187,126 | 1/1940 | Kern et al. | 313/420 |
| 2,617,953 | 11/1952 | Brasch | 313/420 |
| 3,022,960 | 2/1962 | Foster | 242/75.3 |
| 3,290,540 | 12/1966 | Atti | 313/146 |
| 3,544,037 | 12/1970 | Arent | 242/75.3 |
| 3,866,132 | 2/1975 | Gorka | 328/233 |
| 3,867,704 | 2/1975 | Gorka | 328/233 |
| 3,871,597 | 3/1975 | La Mers | 242/75.3 |
| 4,333,036 | 6/1982 | Farrell | 313/420 |
| 4,364,527 | 12/1982 | Bruno | 242/75.51 |
| 4,388,560 | 6/1983 | Robinson et al. | 315/111.81 |

FOREIGN PATENT DOCUMENTS 54-105699 8/1979 Japan .

Primary Examiner—Craig E. Church
Assistant Examiner—Jack I. Berman
Attorney, Agent, or Firm—Anne D. Daniel; James H. Chafin; Judson R. Hightower

[57] ABSTRACT

A self-contained hermetically sealed foil changer for advancing a portion of foil web into a position normal to the path of a high energy particle beam. The path of the beam is defined generally by an aperture plate and cooperating axially movable barrel such that the barrel can be advanced toward the plate thereby positioning a portion of the foil across the beam path and sealing the foil between the barrel and the plate to form a membrane across said beam path. A spooling apparatus contained in the foil changer permits selectively advancing a fresh supply of foil across the beam path without breaking the foil changer seal.

11 Claims, 7 Drawing Figures

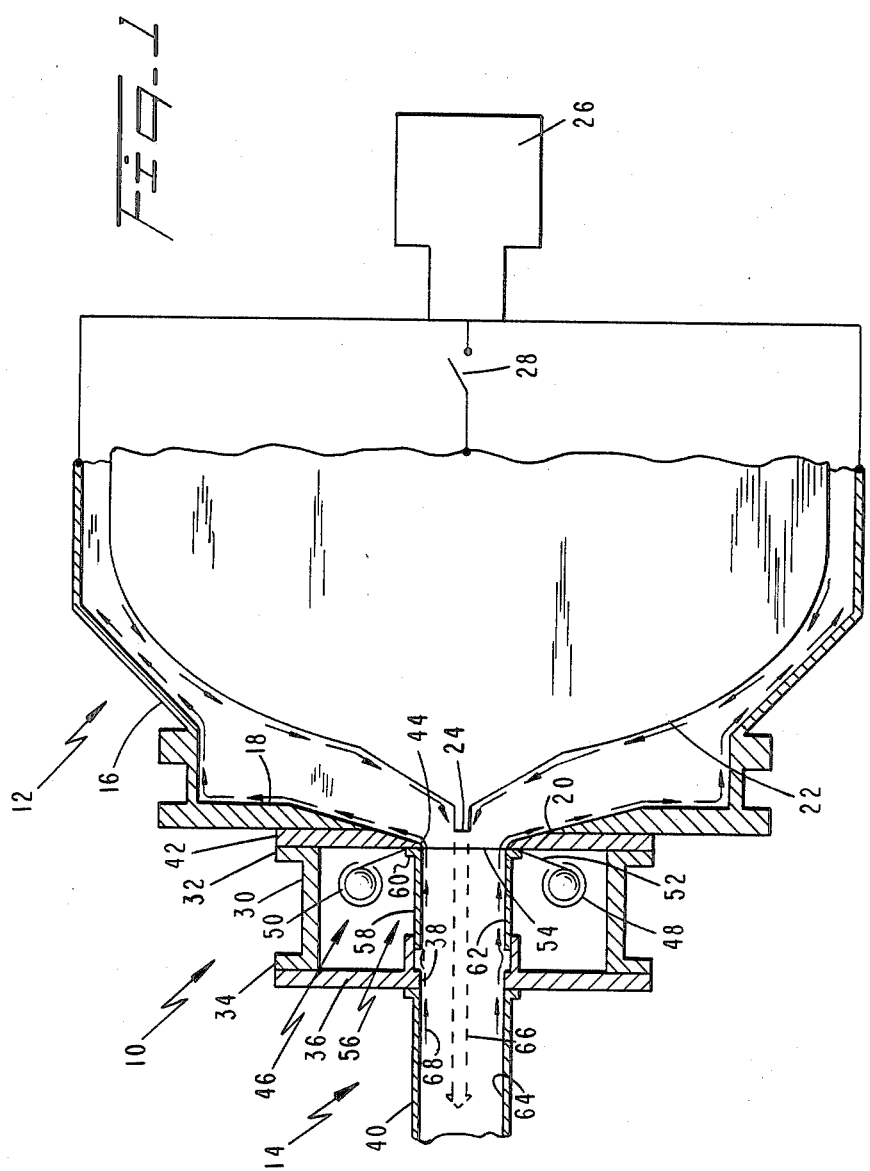

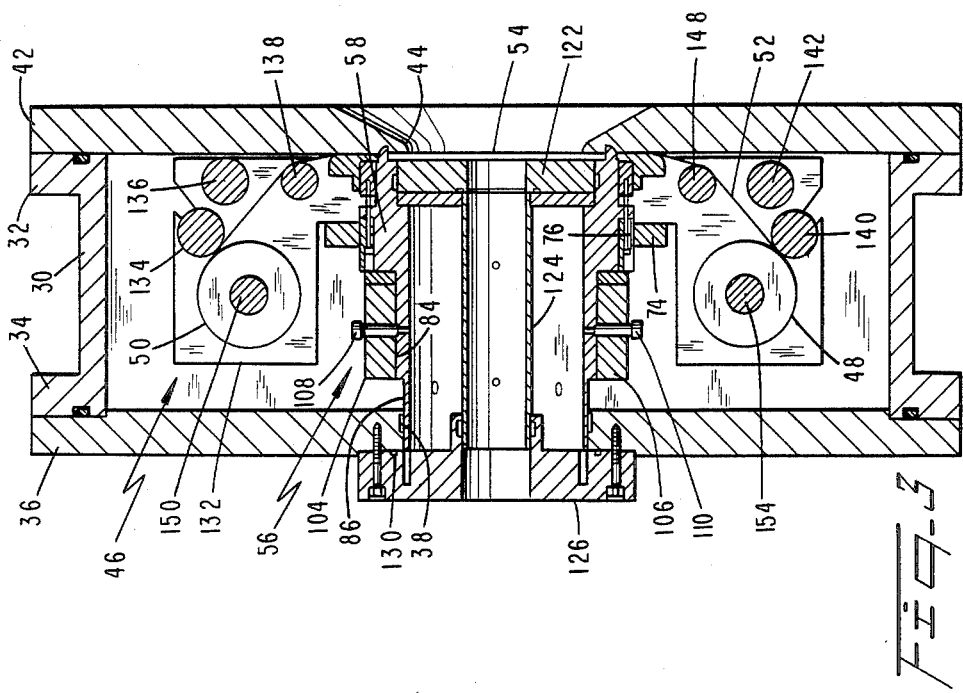

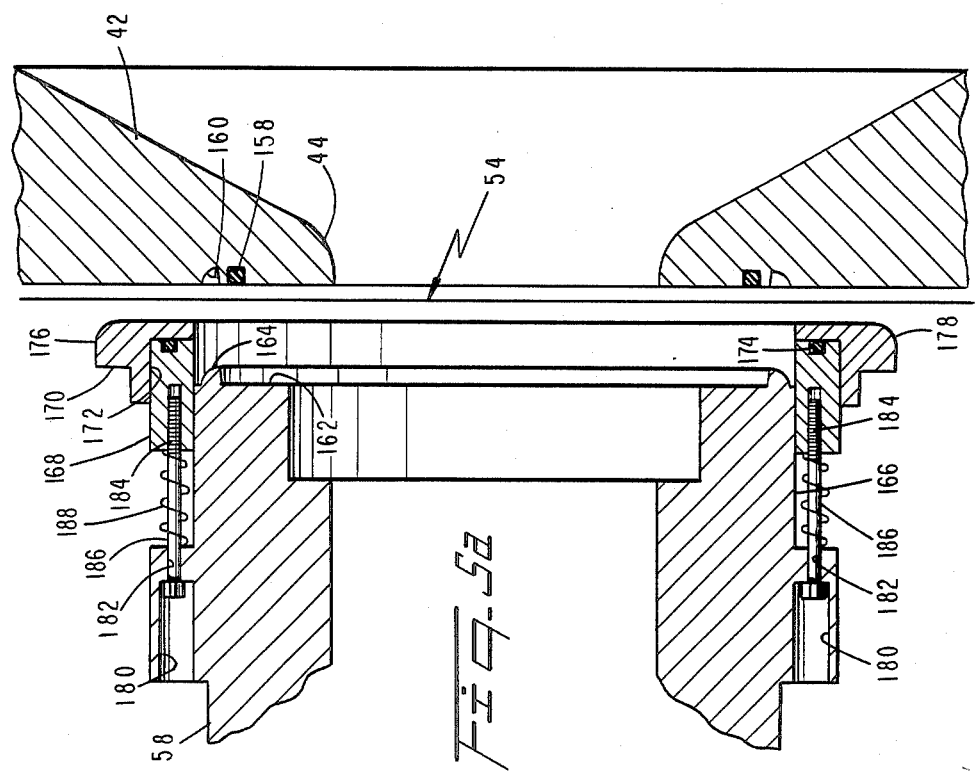
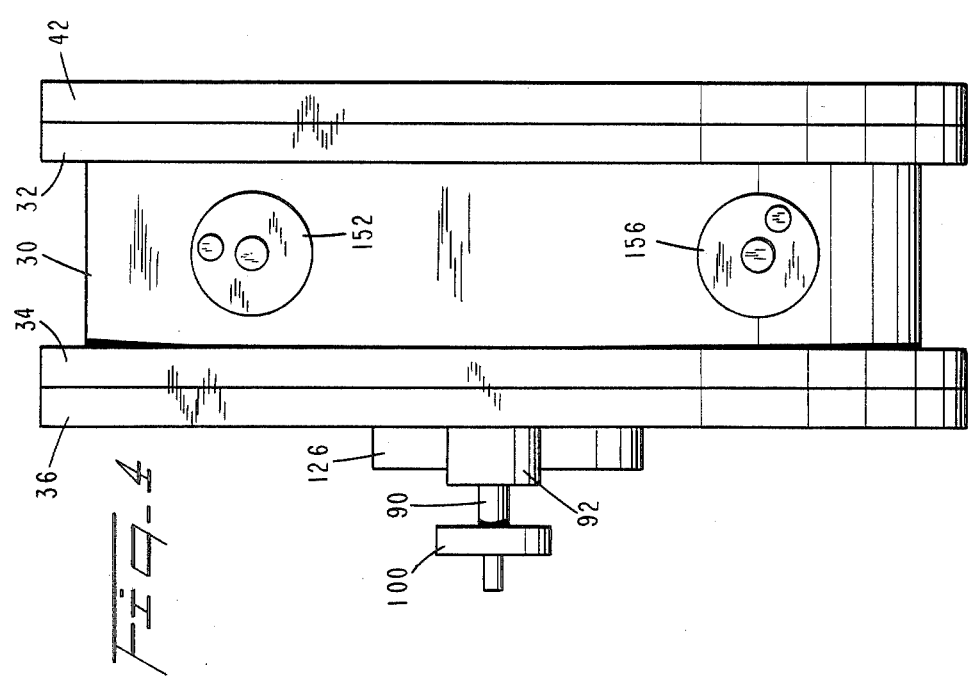

1

FOIL CHANGING APPARATUS

The U.S. Government has rights in this invention pursuant to Contract No. DE-AC04-76DP00789 between the U.S. Department of Energy and AT&T Technologies, Inc.

BACKGROUND OF THE INVENTION

1. Field of the Invention

This invention relates generally to an apparatus which permits replacement of a foil membrane normal to the stream of particles from a high energy particle accelerator and more particularly, but not by way of limitation, to a self contained foil changer which is hermetically sealed and permits changing of the foil without substantially disrupting the controlled environment of the accelerator.

2. History of the Prior Art

High energy particle acceleration devices such as high energy electron beam generators typically operate in a high vacuum condition and normally are connected to a target chamber by suitable propagation tubing. Since often the target chamber and associated propagation tubing are initially held at a different level of vacuum than that of the beam generator, it is necessary to provided a membrane between the beam generator and the propagation tubing to maintain the two levels of vacuum separated until firing of the generator.

The membrane also serves to separate different gas environments in the same manner. It is necessary that the membrane be of a material which will not substantially interfere with accelerated particles or electrons flowing therethrough.

Further, in the case of high energy electron beam generators, a metallic electrically conductive membrane or foil is used in a manner such that the membrane acts as the anode and is positioned adjacent the cathode of the beam generator.

Typically, the electron generator is rather massive and it may take on the order of several hours to pump down the chamber to a sufficiently high vacuum. When the generator is fired, the membrane is usually destroyed and the vacuum level in the generator and the target chamber and associated propagation tubing tend to equalize which is still normally at a rather high vacuum.

It is generally very time consuming and tedious to break the vacuum seal, disconnect the propagation tubing, replace the foil membrane and reassemble the apparatus for the next shot. Even after this is done, again, several hours may be consumed pumping the generator chamber down to the required vacuum for subsequent use.

Another problem also exists in the case of electron beam generators wherein the foil membrane is used as an anode. If the foil is not stretched tightly over the beam passageway and positioned in a plane perpendicular thereto, wrinkles in the foil may occur which can cause the beam to be deflected into the walls of the propagation tubing severely pitting the walls and resulting in destroying the tubing and often causing dangerous x-ray emission upstream of the target area.

SUMMARY OF THE INVENTION

Applicant's invention provides a self-contained foil changing apparatus which is particularly designed and constructed to overcome the problems associated with replenishing spent foil membranes in high energy particle acceleration devices.

The foil changing apparatus is contained in a cylindrical housing which can be interposed between the propagation tubing and the beam generator. A central longitudinal passageway is provided through the housing which defines the beam path. The housing, when installed in the generator system, is hermetically sealed and is provided with operator control shafts which hermetically extend through the housing such that the foil membrane may be replaced in an effective manner without breaking the vacuum seal.

A supply of foil material in web form is contained in the housing on suitable supply and take-up spools positioned on either side of the beam passageway. The spools can be rotated by the control shafts to advance the foil web in order to replenish or replace the portion covering the beam passageway.

A longitudinally moveable thrust barrel is slidably disposed in the housing in a manner which further defines the beam path therethrough. One end of the barrel is configured to selectively contact the foil material and press a peripheral portion thereof into contact within the inside surface of an apertured end plate of the housing to hermetically seal and hold the foil membrane in place during operation of the beam generator. The end of the barrel and the end plate are further configured to actually stretch the foil membrane portion across the passageway to insure that it is flat and also disposed perpendicular to the beam path. The movement of the barrel is also controlled by an operator shaft which is hermetically sealed and extends through the housing.

In use with a high energy electron beam generator, the foil may be of an electrically conductive material and also serve as the anode for the system.

When the barrel is in the advanced position holding the foil in place across the beam path, both the interior of the propagation tubing and the beam generator may be pumped down to the respective required vacuum levels in preparation for a shot. The foil acts as a pressure barrier between the tubing and generator. Sometimes it is desirable to introduce certain gases in either or both of the interiors of the propagation tubing and the beam generator. The foil membrane will also serve as a barrier to prevent intermixing of the gases.

As herein before stated, when a shot is made, the accelerated particles typically destroy the foil membrane and the vacuum pressures in the propagation tubing and the beam generator equalize. At this point, the thrust barrel is retracted thereby releasing the foil web. The damaged or destroyed portion of the web material is then would off on the take-up spool thereby advancing a fresh supply of foil into position across the beam passageway. The barrel is then moved to its advanced position thereby stretching the fresh foil across the aperture again interposing the membrane between the beam generator and the propagation tubing.

Since only a portion of the vacuum was lost by destroying the membrane on the previous shot, the vacuum levels on either side of the new membrane may then be pumped down in a matter of minutes instead of hours thereby greatly enhancing accelerator and manpower utilization.

DESCRIPTION OF THE DRAWINGS

Other and further advantageous features of the present invention will hereinafter more fully appear in connection with a detailed description of the drawings in which:

FIG. 1 is an elevational schematic view, partially in section, depicting a high energy electron beam generator system having a foil changer embodying the present invention.

FIG. 2 is a partially sectioned plan view of the foil changer of FIG. 1 depicting the thrust barrel advance mechanism.

FIG. 3 is an elevational sectional view of the foil changer of FIG. 1 depicting the moveable barrel and foil spooling assembly.

FIG. 4 is an elevational view of the foil changer housing depicting the external controls.

FIGS. 5a, 5b and 5c, are elevational sectional details of the barrel advance and foil positioning apparatus.

DESCRIPTION OF THE PREFERRED EMBODIMENT

Figure 5C:
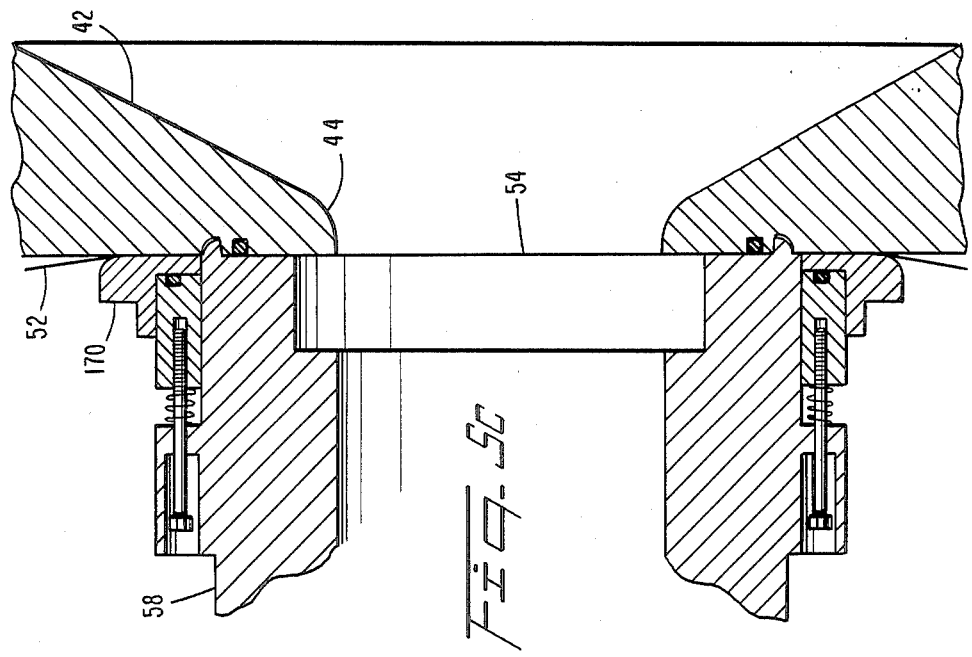

Referring now to FIG. 1 of the drawings, reference character 10 generally indicates a simplified sectional view of the foil changing apparatus of the present invention. The foil changer 10 is interposed between a high energy electron beam generator, generally indicated by reference character 12, and a propagation tubing assembly generally indicated by reference character 14 which is typically in open communication with a down stream target or target chamber (not shown).

The typical electron beam generator 12 comprises a housing 16 having an enlarged interior chamber 18 and a beam exit aperture 20. A cathode 22 is disposed within the chamber and terminates in a cathode tip 24 which is located adjacent the central portion of the aperture 20. The cathode 22 is then operably connected to a capacitor bank 26 through a switching mechanism 28. The capacitor bank 26 may be made up of high-voltage storage capacitors such as a Marx bank.

It is noted that where the electron beam generator 12 is described herein, the foil changer 10 may be utilized with any particle accelerator where it is desirable to interpose a membrane across the path of the particle beam.

The foil changer 10 generally comprises a cylindrical casing 30 having flanges 32 and 34 at either end thereof. The housing is provided with a downstream end plate 36 which is attached to the flange 34 and provided with a central aperture 38 therein. This end plate 36 is then connected by suitable attachment means to a propagation tube 40 which is a part of the propagation tube assembly 14.

At the opposite end of the housing 30 is an end plate 42 having a central aperture 44 therein, the end plate 42 being attached to the housing by flange member 32. The end plate 42 is in turn attached to the housing 16 of the electron beam generator and the aperture 44 thereof is in concentric alignment with the aperture 20 of the beam generator. A spool assembly generally indicated by reference character 46 is disposed within the housing and comprises spool elements 48 and 50 for containing and moving a quantity of anode foil material 52 in the form of a web. The spools 48 and 50 are disposed on opposite sides of the end plate aperture 44 so that a portion of the foil material indicated by reference character 54 is disposed across the end plate aperture 44.

A suitable O-ring 37, shown in FIG. 2, is disposed between the end plate 36 and its attachment to the flange member 34 for hermetically sealing the interior of the housing. Likewise, O-ring 39 is interposed between the flange 32 and the end plate 42 for purposes of hermetically sealing the interior of the housing.

A movable barrel assembly generally indicated by reference character 56 is longitudinally disposed inside the housing 30 in concentric alignment with the apertures 44 of end plates 42 and 38 of the down stream end plate 36. The barrel assembly 56 comprises a movable thrust barrel 58 having a foil contact end portion 60. When the barrel 58 is in its advanced position as shown in FIG. 1, the contact end portion 60 serves to press and hold the foil segment 54 peripherally around the aperture 44 of the end plate 42 such that the foil portion 54 forms a membrane across said aperture 44.

The beam passageway is therefore generally defined by the aperture 44, an interior surface 62 of the thrust barrel 58, the aperture 38 of end plate 36 and an interior surface 64 of propagation tube 40.

The foil material portion 54 which is disposed across the end plate aperture 44 is typically a metallic electrically conductive material such that the portion 54 of the foil material acts as an anode and is disposed adjacent the cathode tip 24 as shown in FIG. 1. When the electron beam generator switch 28 is closed, a stream of electrons is emitted from the cathode tip 24 and are accelerated by the anode foil portion 54 thereby forming an electron beam indicated by the dash lines of reference character 66 which travel down the central portion of the propagation tube 40 and toward a target (not shown). Simultaneously, upon closing the switch 28 there is a current flow in a reverse direction along the inside walls of the beam passageway made up of the propagation tube 40 and the interior of the foil changer 10 back into the housing 16 of the electron beam generator 12. This reverse current flow is indicated by the plurality of arrow members 68.

Referring to FIGS. 2 and 3 of the drawings, a mounting block 70 is secured to the inside surface of end plate 36 on one side of the aperture 38 therein. An oppositely disposed U-shaped mounting bracket 72 is also secured to the inside surface of end plate 36. A guide plate 74 having a circular aperture 76 therein is secured to the mounting block 70 by suitable screws 78 and to inwardly extending ears 80 of the U-shaped bracket 72 by screws 82.

The barrel member 58 is slidably disposed in the aperture 76 of guide plate 74 as shown in FIG. 3. The barrel member 58 has a centrally reduced diameter portion 84 and an end reduced diameter portion 86 which is slidably received in the aperture 38 of end plate 36.

A barrel control assembly generally indicated by reference character 88 is carried by the housing and operable connected to the movable barrel 58. The barrel control assembly comprises an elongated longitudinally disposed shaft 90 which extends through the end plate 36 and is journaled in a sealing block 92. The inner end of the shaft 90 is threadedly secured to an end plate 94 which is a part of the U-shaped bracket member 72. A pair of spaced drive collars 96 and 98 are carried by the shaft 90 internal of the U-shaped bracket 72. The outer end of the shaft 90 is provided with a suitable manually operated crank arm 100.

The barrel control assembly 88 further comprises an elongated yoke member 102 which is transversely disposed inside the housing as shown in FIG. 2, and acts as a lever arm in a manner that will be hereinafter set forth. The yoke member 102 has a pair of spaced yoke arms 104 and 106 which straddle the reduced diameter portion 84 of the barrel 58 and are pivotally pinned thereto by pin members 108 and 110 and cooperating slots 112, one of which is shown in FIG. 2. The distal ends of the yoke arms 104 and 106 are pivotally secured to the mounting block 70 by pivot pins 114, one of which is shown in FIG. 2. The central portions of the yoke arms 104 and 106 are provided with rounded contact nubs 116 which in turn contact a shoulder portion 118 of the barrel 58. The opposite end of the yoke member 102 is provided with a slot 120 for receiving the operator shaft 90 therein. The end of the yoke member on either side of the slot 120 is disposed between the collar members 96 and 98 of the operator shaft 90.

When it is desirable to advance the barrel 58 to the right as shown in the drawings, the operator shaft 90 is rotated by crank arm 100 in a first direction thereby advancing the threaded end portion through block 94. The advancing collar member 96 will thereby push one end of the yoke 102 to the right. The yoke pivots about pin 114 and the nub member 116 pushes the barrel 58 to the right through guide plate 74.

When it is desirable to retract the barrel 58, the operator shaft 90 is rotated in the opposite direction thereby causing collar member 98 to pull the upper end of the yoke member 102 to the left which again pivots said yoke member about pin member 114. In this case the reaction of the pin 110 with the slot 112 causes the barrel 58 to slide to the left again being guided by guide plate 74 and aperture 38 in the end plate 36.

The foil changer 10 may be used in various applications, some of which might require that the beam passageway therethrough be reduced in size. This reduction in size may be accomplished by a suitable insert aperture in end plate 122 the outer periphery of which is attached to the barrel 58 as shown in FIG. 3. The insert may then carry one end of a longitudinally disposed beam passageway tube member 124. An oppositely disposed apertured end plate 126 is attached to the end plate 36 surrounding the aperture 38. The opposite end of the tube member 124 is carried thereby. This apertured plate 126 is typically attached to the propagation tubing assembly 14. It is noted that when the apertured end plate 126 is smaller than the aperture 38, it is necessary to provide an annular slot 128 for receiving the reduced end portion 86 of the barrel 58 when said barrel 58 is retracted or moved to the left as shown in FIGS. 2 and 3. Also the end plate 126 is provided with the suitable O-ring 130 to further hermetically seal the interior of the housing.

Referring now to FIGS. 3 and 4, the foil web supply and take up reel assembly 46 is constructed as a cartridge having frame 132 and structural crossmembers 136 and 142. Supply and take-up spools 48 and 50 are rotatingly carried by the frame 132. Associated with the spool 50 are guide and tension rollers 134 and 138. Associated with the spool 48 are guide and tension rollers 140 and 148 as shown in FIG. 3. A first operator shaft 150 is operably connected to spool 50 and extends through the housing 30, the outer end of which terminates in a crank arm member 152. The shaft 150 is hermetically sealed with respect to the housing in a manner similar to that of the operator shaft 90 hereinbefore described. An operator shaft 154 is operably connected to the spool member 48 and in a like manner extends through the housing and terminates in an operator crank arm member 156.

Hence, the foil web 52 may be carried as a supply on either of the spools 48 or 50 with the opposite spool serving as a take-up in order to wind a fresh supply of foil 54 across the beam passageway.

Figure 5B:
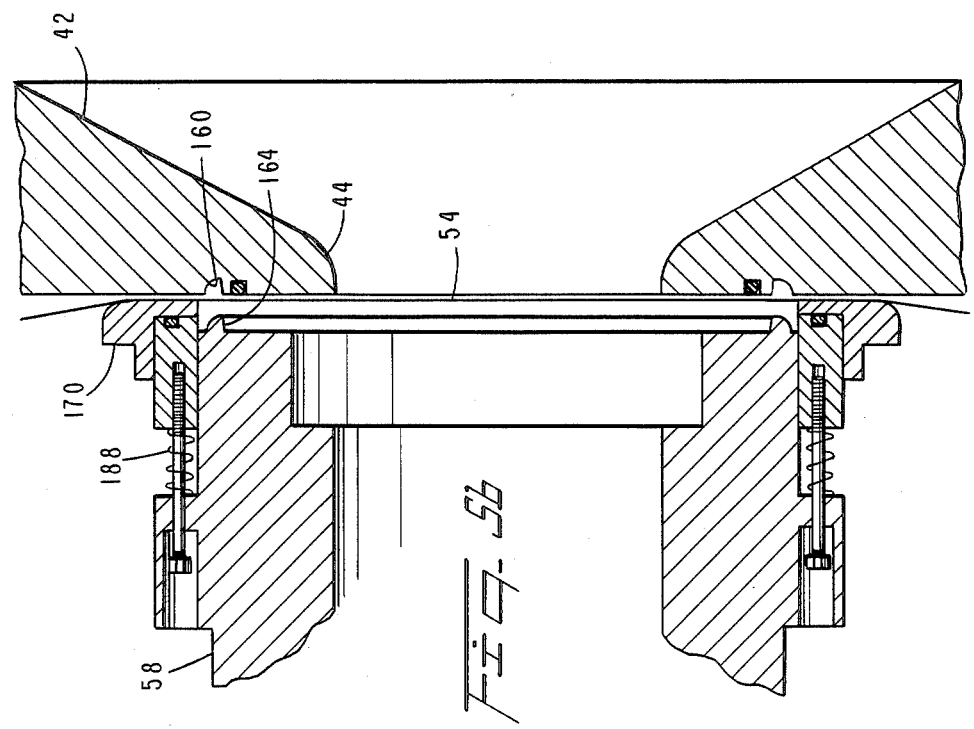

Referring now to FIGS. 5a, 5b and 5c, an O-ring seal 158 is provided on the inside surface of end plate 42 surrounding the aperture 44. An annular groove 160 is also provided on the inside surface of the end plate 42 and surrounds the groove containing O-ring 158 for a purpose that will be hereinafter set forth.

The barrel 58 is provided with an end surface 162 for contacting the inside surface of end plate 42 when the barrel is in its advanced position as shown in FIG. 5c. The end surface 162 is provided with an outwardly extending annular protrusion 164 which is disposed in alignment with annular groove 160. The end portion of the barrel 58 is also provided with a reduced diameter portion 166 on which a ring member 168 is slidably disposed. A foil pressure plate 170 is secured to and carried by the slidable ring member 168. The pressure plate 170 may be rectangular in shape and is provided with a circular recess 172 for receiving the sliding ring member 168 therein. An O-ring 174 functions as a hydrostatic cushion between ring member 168 and pressure plate 170. The pressure plate 170 is provided with curved smooth edges at 176 and 178 for permitting the foil 52 to slide thereacross without damage.

Barrel member 58 is provided with a plurality of longitudinal recesses 180 terminating in bores 182. The sliding ring member 168 is provided with threaded bores 184 which are in alignment with the bores 182 of the barrel 58. A plurality of pin members 186 are slidably disposed in the recesses 180 and bores 182 as shown in FIGS. 5a, 5b and 5c, the outer ends of the pins 186 being threadedly secured in the bores 184. A plurality of compresson springs 188 surround the pin members 186 and serve to exert a compression force between the barrel 58 and the pressure plate 170 thereby forcing the pressure plate 170 out toward the foil web 54 as shown in FIG. 5a.

In operation, prior to a shot being made by the high energy electron beam generator 12, the barrel 58 is retracted by the barrel control assembly 88 as shown in FIG. 5a. The spooling assembly 46 is then operated to move a fresh supply of anode foil material 54 into position across the aperture 44 of end plate 42 as shown in FIG. 5a. Note that with barrel 58 retracted as shown in FIG. 5a, clearance exists between foil 54 and pressure plate 170 on the left side, and foil 54 and end plate 42 on the right side. Foil with gross damage features projecting from the surface on either side may then pass undeterred therein. When the foil is in place, the barrel control assembly is operated to start the barrel 58 moving toward end plate 42 as shown in FIG. 5b. The pressure plate 170, being extended by compression springs 188, forces the foil 52 into contact with the inside surface of end plate 42 thereby holding a portion of the foil 54 over the aperture 44. The barrel 58 is then fully advanced against the inside surface of the end plate 42. At this point the annular protrusion 164 forces an annular portion of the foil material 52 into the annular groove 160 of end plate 42 thereby stretching the foil portion 54 tightly over the aperture 44 of end plate 42 as shown in FIG. 5c. The foil portion 54 then becomes a sealed membrane covering aperture 44 thereby sealing off the interior of the beam generator 12 from the interior of the propagation tubing 14.

At this point the interior chamber 18 of the accelerator 12 may then be pumped down to its desired vacuum as can be the interior of the propagation tubing assembly 14 with the foil portion 54 acting as a membrane therebetween. Also, it is noted that desirable gases may be introduced into the propagation tubing or into the interior of the accelerator as desired. A shot may then be made by closing switch 28 of the beam generator thereby causing a flow of electrons through the foil membrane 54 and thence through the propagation tubing 14 to the target zone.

As herein before stated, each shot will tend to destroy the anode foil membrane 54 thereby equalizing the pressures inside the beam generator 12 and the propagation tubing 14. However, since typically the interior of the beam generator 12 and the propagation tubing 14 are both at some vacuum level, the entire vacuum will not be lost due to the shot. The foil portion 54 may then be replaced by simply retracting the barrel 58 to the position as shown in FIG. 5a, advancing the foil so that the destroyed or used foil is would up on one of the spools 48 or 50 while new foil is advanced into position. The system is again sealed by advancing the barrel to the position as shown in FIG. 5c.

It can be appreciated that since the entire vacuum has not been lost by the shot, that the accelerator may be pumped down to its required vacuum in a much shorter time.

From the foregoing it is apparent that the present invention provides an efficient apparatus for changing foil membranes in high energy particle beam acceleration applications.

It is noted that whereas the barrel control assembly and the spooler control members depict manually operable crank arms 100, 152 and 156, these operator control shafts could in fact be connected to motorized drive means (not shown) which in turn could be controlled by a sequencer mechanism so that replacement of the anode foil across the aperture could be done automatically between accelerator shots.

Whereas, the present invention has been particularly described in conjunction with the drawings attached hereto, it is apparent that other and further modifications may be made to the device within the spirit and scope of the invention.

We claim:

1. A self-contained foil changer apparatus for replenishing foil material across the path of a high energy particle beam, the apparatus comprising:
   a cylindrical hermetically sealed housing comprising an end plate having an aperture defining a beam passageway therethrough, one end of the housing being attachable to a high energy particle accelerator and the opposite end being attachable to a beam propagation tube;
   foil supply means disposed inside the housing for storing a foil web and supporting a portion of said web across the beam passageway to form a plane perpendicular to the beam path;
   a barrel assembly disposed inside the housing and comprising a longitudinally disposed cylindrical barrel being movable from an advanced position wherein said portion of the foil web is gripped between one end of the barrel and the end plate surrounding the aperture to a retracted position thereby freeing the web from contact with said end plate;
   web control means extending through the housing and operably connected to the foil supply means for selectively advancing the foil web to replenish a portion across the beam passageway; and
   barrel control means extending through the housing and operably connected to the barrel assembly for selectively moving the barrel to and from the advanced and retracted positions, said barrel control means comprising a lever arm transversely disposed inside the housing and pivotally secured thereto, said lever arm being also pivotally secured to the movable barrel and operator shaft means journaled through the housing and having one end portion operably connected to the lever arm, for moving the lever in either direction about its pivotal connection to impart longitudinal movement to the barrel.

2. A foil changer apparatus as set forth in claim 1 wherein the foil supply means comprises a removable cartridge having cooperating web supply and take-up spools disposed on opposite sides of the barrel assembly said cartridge being completely removable without disassembly of spool operating shafts.

3. A foil changer apparatus as set forth in claim 2 wherein the web control means comprises a first operator shaft journaled through the housing, one end of which is operably connected to the take-up spool and the opposite end of which is capable of being rotated external of the housing.

4. A foil changer apparatus as set forth in claim 3 wherein the web control means comprises a second operator shaft journaled through the housing, one end of which is operably connected to the supply spool and the opposite end of which is capable of being rotated external of the housing.

5. A foil changer apparatus as set forth in claim 1 wherein the barrel assembly comprises a guide plate connected to the inside of the housing and having an aperture therein for slidably receiving and supporting the movable barrel.

6. A foil changer apparatus as set forth in claim 1 wherein the barrel assembly comprises a foil pressure plate having an aperture there through surrounding one end of the barrel and being yieldably, slidably carried thereby such that as the barrel is moved toward the advanced position, the pressure plate moves the foil into contact with the end plate before the end of the barrel completes its travel to the advanced position.

7. A foil changer apparatus as set forth in claim 1 wherein the end plate is provided with an inwardly facing annular groove surrounding the aperture therein and one end of the moveable barrel is provided with a cooperating annular protrusion such that when the barrel is moved to its advanced position, the annular protrusion forces an annular portion of the foil web into the annular groove of the end plate thereby stretching the foil tightly across the aperture in a plane perpendicular to the path of the particle beam.

8. A foil changer apparatus as set forth in claim 1 and including sealing means interposed between the housing end plate and the barrel assembly such that when the movable barrel is in the advanced position, the foil acts as a membrane permitting different atmospheric pressures on either side thereof.

9. A foil changer apparatus as set forth in claim 1 wherein the end plate, the barrel assembly and the foil web are electrically conductive and wherein the particle accelerator is an electron beam generator whereby said portion of the web across the beam passageway serves as anode for the electron beam generator.

10. A foil changer apparatus as set forth in claim 1 said barrel assembly including a removable bore insert such that the effective bore of the barrel may be changed without the need for replacement of additional parts or disassembly of the barrel.

11. A foil changer apparatus as set forth in claim 1 wherein said operator shaft means has an outer end rotatably connected to the lever arm.

* * * * *